(12) United States Patent
Hsieh

(10) Patent No.: US 9,359,193 B2
(45) Date of Patent: Jun. 7, 2016

(54) METHOD FOR MANUFACTURING AN INTEGRATED MEMS DEVICE

(71) Applicant: Asia Pacific Microsystems, Inc., Hsinchu (TW)

(72) Inventor: Jerwei Hsieh, Hsinchu (TW)

(73) Assignee: Asia Pacific Microsystems, Inc., Hsinchu (TW)

( * ) Notice: Subject to any disclaimer, the term of this patent is extended or adjusted under 35 U.S.C. 154(b) by 12 days.

(21) Appl. No.: 14/165,752

(22) Filed: Jan. 28, 2014

(65) Prior Publication Data
US 2015/0274514 A1   Oct. 1, 2015

(30) Foreign Application Priority Data

Jan. 28, 2013  (TW) ............................. 102201843 U
Jul. 30, 2013  (TW) ............................. 102127210 A

(51) Int. Cl.
*H01L 21/4763*   (2006.01)
*B81C 1/00*   (2006.01)
*B81B 7/00*   (2006.01)

(52) U.S. Cl.
CPC ........... *B81C 1/00238* (2013.01); *B81B 7/0058* (2013.01); *B81C 1/00825* (2013.01); *B81C 2201/053* (2013.01)

(58) Field of Classification Search
CPC ............ H01L 21/4763; H01L 21/7806; H01L 21/76801; H01L 21/76802

USPC ....................................... 438/53.624; 257/416
See application file for complete search history.

(56) References Cited

U.S. PATENT DOCUMENTS

| | | | |
|---|---|---|---|
| 5,083,857 A | 1/1992 | Hornbeck | |
| 6,525,864 B1 | 2/2003 | Gee et al. | |
| 6,635,506 B2 | 10/2003 | Volant et al. | |
| 7,015,885 B2 | 3/2006 | Novotny et al. | |
| 7,291,513 B2 | 11/2007 | Ouellet et al. | |
| 7,442,570 B2 | 10/2008 | Nasiri et al. | |
| 8,143,082 B2 | 3/2012 | Dungan et al. | |
| 8,217,474 B2 | 7/2012 | Lee et al. | |
| 8,269,291 B2 | 9/2012 | Buchwalter et al. | |
| 2003/0107794 A1 | 6/2003 | Siekkinen et al. | |
| 2011/0018117 A1* | 1/2011 | Yang et al. | 257/690 |
| 2011/0027941 A1* | 2/2011 | Kumar et al. | 438/106 |
| 2014/0159066 A1* | 6/2014 | Hu et al. | 257/88 |

* cited by examiner

*Primary Examiner* — Phuc Dang
(74) *Attorney, Agent, or Firm* — Alan D. Kamrath; Kamrath IP Lawfirm, P.A.

(57) ABSTRACT

An integrated MEMS device and its manufacturing method are provided. In the manufacturing method, the sacrificial layer is used to integrate the MEMS wafer and the circuit wafer. The advantage of the present invention comprises preventing films on the circuit wafer from being damaged during process. By the manufacturing method, a mechanically and thermally stable structure material, for example: monocrystalline silicon and polysilicon, can be used. The integrated MEMS device manufactured can also possess the merit of planar top-surface topography with high fill factor. The manufacturing method is especially suitable for manufacturing MEMS array device.

14 Claims, 21 Drawing Sheets

METHOD FOR MANUFACTURING AN INTEGRATED MEMS DEVICE

FIELD OF THE INVENTION

The present invention relates to an integrated MEMS device and a manufacturing method for manufacturing the same, especially a method for manufacturing an integrated MEMS device in which a MEMS wafer and a circuit wafer are bonded together first and then a sacrificial layer is removed.

BACKGROUND OF THE INVENTION

Techniques for integrating MEMS devices and circuit chips are important especially for the application of MEMS array-type devices. Through these techniques it is possible to integrate MEMS units of the MEMS array-type devices such as capacitive micromachined ultrasonic transducer (CMUT) and reflective micromirror array and circuit chips, thereby achieving the most effective electrical connections and control. For example, the optical array-type devices commonly adopted for many fields comprise a plurality of reflective micromirrors. These reflective micromirrors may rotate about a fixed axis to guide light toward an emitting direction. Please refer to FIG. 1. FIG. 1 illustrates a structure of the optical array-type device disclosed by U.S. Pat. No. 5,083,857. This optical array-type device 10 comprises a reflective mirror 11 and a flexible structure 15. The reflective mirror 11 is firmly connected to the flexible structure 15 via a anchor structure 12. Furthermore, the optical array-type device 10 also comprises an electrode 14. The electrode and the flexible structure 15 jointly form an actuator unit. It is possible to control the deformation of the flexible structure 15 hence the inclination angle of the reflective mirror 11 (see dashed lines 11a and 11b in FIG. 1) through inputting a control signal to the electrode 14. By adjusting the inclination angle of the reflective mirror 11, it is possible to adjust the light emitting direction in order to generate the expected optical effect. Since more planar the surface of the reflective mirror 11 is the bigger the effective area lit by the incident light is, the flexible structure 15 is designed to be hidden under the reflective mirror 11. This would better the device performance, but also make the manufacturing process more challenging. Moreover, it is noted from FIG. 1 that a recess 13 is formed right in the center of the reflective mirror 11. The recess 13 rises from a process of manufacturing the anchor structure 12 and it would prevent the light passing therethrough from being reflected effectively, thereby reducing device performance. In the process for manufacturing the optical array-type device 10, the reflective mirror 11 is formed by performing micromachining processes on a circuit wafer (please refer to FIGS. 7a-7b in U.S. Pat. No. 5,083,857 for detailed manufacturing processes). In order to avoid adversely affecting the circuitry on/in the circuit wafer, process temperatures and materials used to manufacture the optical array-type device should be limited to low temperature formed materials such as metals. However, this limitation would degrade structural reliability, surface roughness and surface topography hence total quality of the finished optical array-type device 10.

SUMMARY OF THE INVENTION

To solve the above problems, a method for manufacturing an integrated MEMS device is provided. Preferably, in this method, a plurality of sacrificial layers is used. Due to the etching selectivity between the sacrificial layers, films on the circuit wafer would not be damaged while removing the sacrificial layers. Therefore, it is possible to form a surface structure with extremely planar surface and elements hidden under the surface structure such as a rotation shaft, a flexible device, an actuator or a sensor. Furthermore, the MEMS structure may comprise high piezoresistive materials such as monocrystalline silicon and polysilicon hence piezoresistive sensing function, so the method and device of the present invention may be applied to fields adopting open-loop actuators, close-loop actuators or array-type MEMS sensors such as micromachined ultrasonic transducers (MUT) and reflective micromirror array and satisfies their requirements.

In light of the above and other objectives, the present invention provides a method for manufacturing an integrated MEMS device comprising the following steps. First a device wafer is provided, wherein the device wafer comprises a first surface (for example the front side surface of the device wafer) and a second surface opposite to the first surface (for example the backside surface of the device wafer). Then, a first sacrificial layer and a first structural layer are formed and patterned on the first surface of the device wafer, wherein the first sacrificial layer supports the first structural layer. Next, a second bonding layer is formed and patterned on the first structural layer. Next, a circuit wafer is provided, wherein the circuit wafer comprises at least a patterned first bonding layer on a surface thereof. Next, the device wafer and the circuit wafer are bonded against each other so the first bonding layer and the second bonding layer are bonded together. Next, the device wafer is patterned from its backside surface to form a patterned second structural layer, wherein there are many openings formed in the patterned second structural layer in order to expose a portion of the first sacrificial layer. Next, the portion of the first sacrificial layer exposed by the openings is removed. The second structure layer and the first structure layer are composed of one or more silicon materials with different conductivities. For example, when a device is made for an electrostatic microactuator application, the silicon materials used need to have high dopant concentration (that is, high concentration of n-type or p-type dopants) in order to provide high conductivity. When a device is made for a piezoresistive sensing application, the silicon materials used need to have multiple localized piezoresistive regions of low dopant concentrations and a connecting/bonding region of high dopant concentration. The second bonding layer and the first bonding layer mainly composed of bondable conductive materials such as gold (Au), silver (Ag), copper (Cu), tin (Sn), aluminum (Al), silicon (Si), germanium (Ge) or their combination. The first sacrificial layer is mainly composed of a material which gives high etching selectivity with respect to silicon such as silicon oxide.

In the foregoing method for manufacturing an integrated MEMS device, the second bonding layer and the steps involving the second bonding layer may be omitted based on the design and material selection. In such case, the first structural layer and the first bonding layer are directly bonded together, wherein the material of the first structural layer is polysilicon or amorphous silicon and that of the first bonding layer is a bondable conductive material such as Au.

The foregoing method for manufacturing an integrated MEMS device further comprises the following step before forming the second bonding layer: a second sacrificial layer is formed on the device wafer to cover a surface of the device wafer for example to cover the whole first structural layer and a portion of the first sacrificial layer. The method further comprises the following step after removing the first sacrificial layer: a portion of the second sacrificial layer is removed. The purpose of disposing the second sacrificial layer is to solve the following issue: the etching solution used to remove the first sacrificial layer would attack the materials on the circuit wafer and cause defects. By disposing the second sacrificial layer to cover the surface of the device, the etching solution would be separated from the circuit wafer by the second sacrificial layer so the issue of the circuit wafer being attacked by the etching solution for the first sacrificial layer could be avoided. After removing the first sacrificial layer, an etching solution that has substantially low etching rate to the materials on the surface of the circuit wafer may be used to remove the second sacrificial layer. Because a portion of the second sacrificial layer is disposed between the second bonding layer and the first structural layer, that portion of the second sacrificial layer would remain to become a portion of the electrical connection between the circuit wafer and the device wafer and the rest exposed portion of the second sacrificial layer would be completely removed.

Except using the second sacrificial layer to protect the materials on the surface of the circuit wafer, alternatively it is possible to cover the circuit wafer with a protective layer such as a polymer layer so the area other than the first bonding layer would be covered. Therefore, when the first sacrificial layer is wet etched, the protective layer made of polymer would protect the materials on the surface of the circuit wafer due to the etching-resistant characteristics of the polymer. Thus, the second sacrificial layer is not necessary for the manufacturing method. It is noted that since polymer usually can not withstand high temperature, bonding the device wafer and the circuit wafer should avoid processes requiring high temperature such as a process of temperature higher than 300 Celsius.

The foregoing method for manufacturing an integrated MEMS device further comprises the following step before patterning the device wafer: the device wafer is thinned down. The device wafer comprises a silicon device layer, an insulating layer and a silicon substrate, wherein the first surface is on the silicon device layer and the second surface is on the silicon substrate. The step of thinning down the device wafer comprises the following steps. First the silicon substrate is removed by polishing or wet etching then the insulating layer is removed.

In light of the above and other objectives, the present invention provides an integrated MEMS device manufactured by the foregoing method to be applied to integrated MEMS device with CMOS circuitry such as capacitive ultrasonic transducer. The integrated MEMS device comprises a circuit chip and a device chip. A patterned first bonding layer composed of a bondable conductive material/materials is disposed on the circuit chip. The device chip comprises a first structural layer and a second structural layer, wherein the first structural layer is connected to the second structural layer and between the second structural layer and the circuit chip. There are many hermetic spaces formed between the second structural layer and the circuit chip, wherein the hermetic spaces are enclosed by the first structural layer, the second structural layer and the circuit chip. These hermetic spaces are in vacuum state. As mentioned earlier with respect to the manufacturing method, the integrated MEMS device may further comprise a second bonding layer between the first structural layer and the first bonding layer, wherein the second bonding layer is composed of a bondable conductive material/materials. Alternatively, there may be a second, sacrificial layer between the second bonding layer and the first structural layer, wherein the second sacrificial layer is composed of a conductive material/materials.

DETAILED DESCRIPTION OF PREFERRED EMBODIMENTS

Figure 2A:
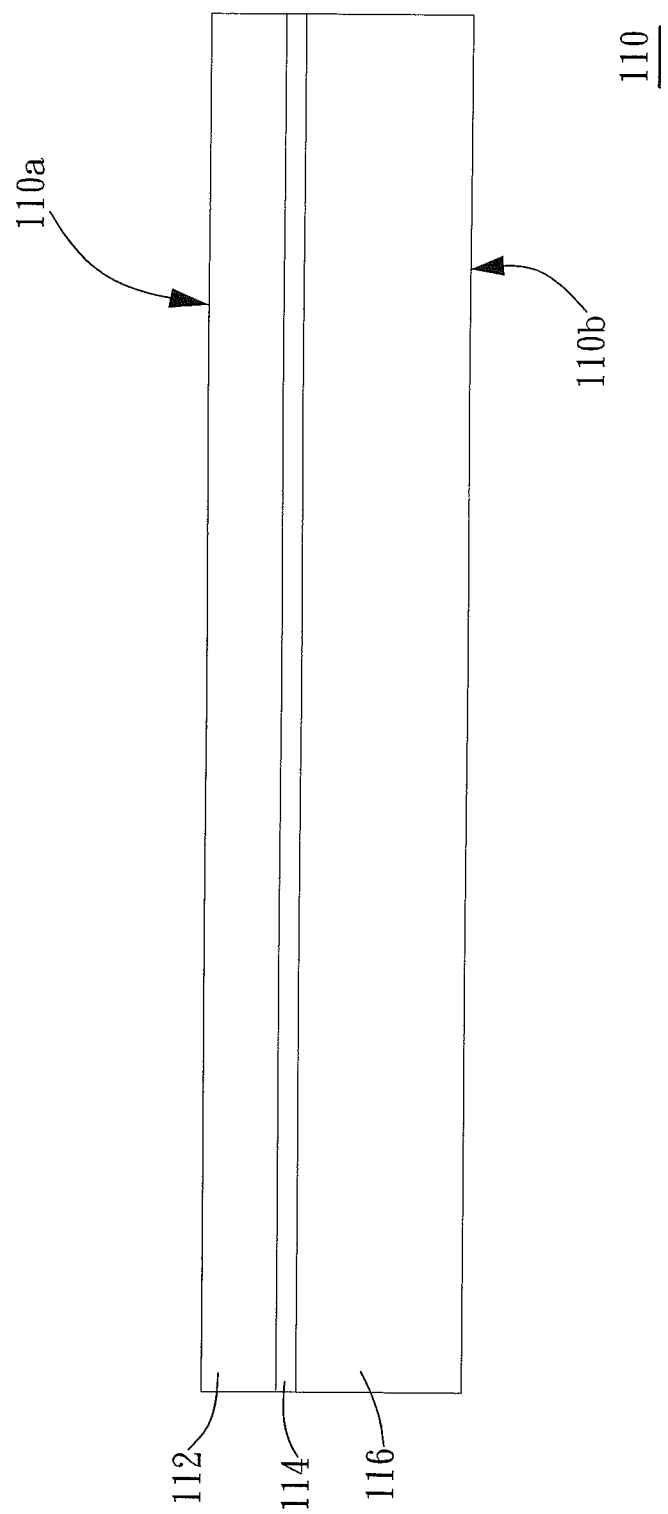
FIGS. 2A-2J illustrate a method for manufacturing the integrated MEMS device according to one embodiment of the present invention.

Please refer to FIGS. 2A-2J which show an embodiment of a method for manufacturing the integrated MEMS device according to one embodiment of the present invention. First, provide a device wafer 110 as shown in FIG. 2A. The device wafer 110 comprises a first surface 110a and a second surface 110b. The second surface 110b is on the opposite side of the device wafer 110 with respect to the first surface 110a. In this embodiment, the device wafer 110 is a silicon-on-insulator (SOI) structure. The device wafer 110 comprises a silicon device layer 112, an insulating layer 114 and a silicon substrate 116, wherein the first surface 110a is on the silicon device layer 112 and the second surface 110b is on the silicon substrate 116.

Figure 2B:
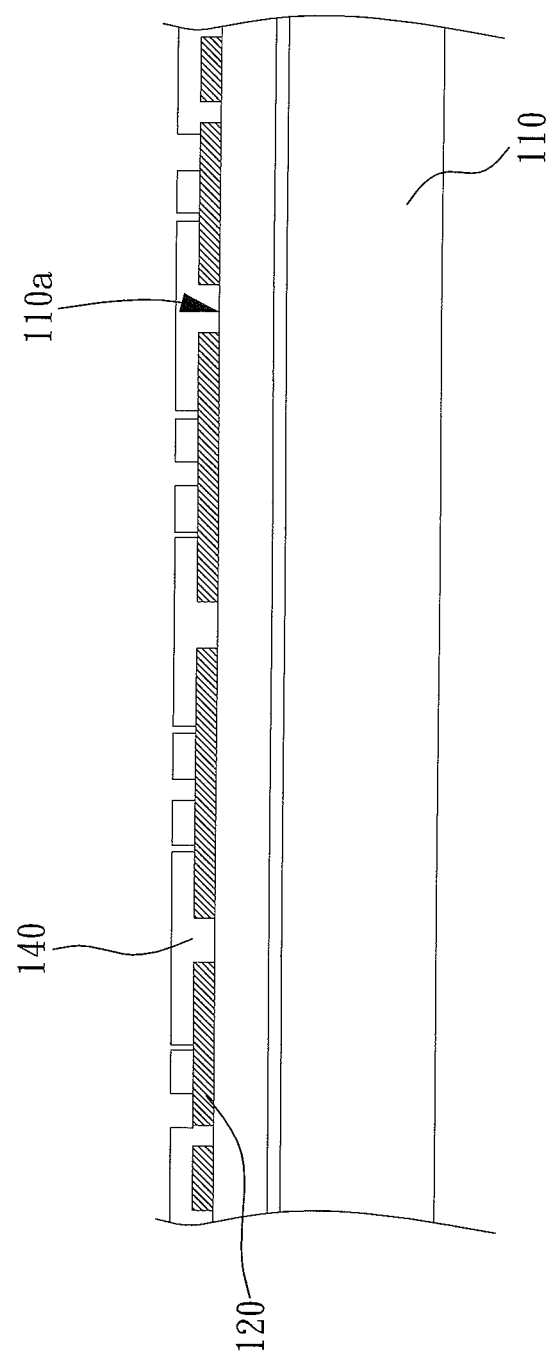

Next, as shown in FIG. 2B, a first sacrificial layer 120 and a first structural layer 140 are sequentially formed on the first surface 110a on the device wafer 110, wherein the first structural layer 140 partially covers the first sacrificial layer 120. In this embodiment, the first structural layer 140 is mainly composed of polysilicon, monocrystalline silicon, or amorphous silicon and the first sacrificial layer 120 is mainly composed of silicon oxide, wherein the first sacrificial layer 120 and the first structural layer 140 are patterned by photolithography and etching processes.

Figure 2C:
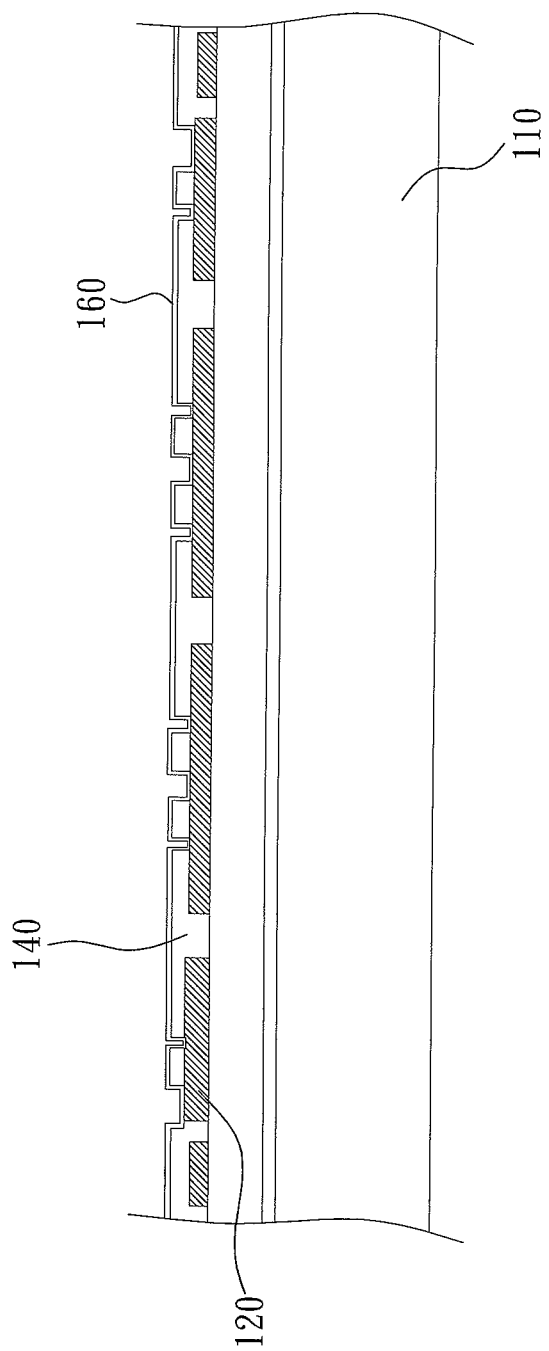

Next, a second sacrificial layer 160 is formed to cover the whole device wafer 110 including the first structural layer 140 and a portion of the first sacrificial layer 120 as shown in FIG. 2C. It is clear from the FIG. 2C that a portion of the second sacrificial layer 160 is in contact with the first sacrificial layer 120 because the first structural layer 140 is patterned before the formation of the second sacrificial layer 160. In this embodiment, the second sacrificial layer is made from a conductive material/materials such as copper or chromium. In this embodiment, the material/materials of the second sacrificial layer 160 needs/need to meet the following requirements:

1) good adhesion ability;
2) good etching selectivity with respect to a bonding material/materials of the bonding layer such as silicon oxide, aluminum, gold, tin, germanium;
3) capable of withstanding the process temperature during bonding of the device wafer 110 and the circuit wafer 210;
4) would not crack due to high stress during etching of the first sacrificial layer 120.

Figure 2D:
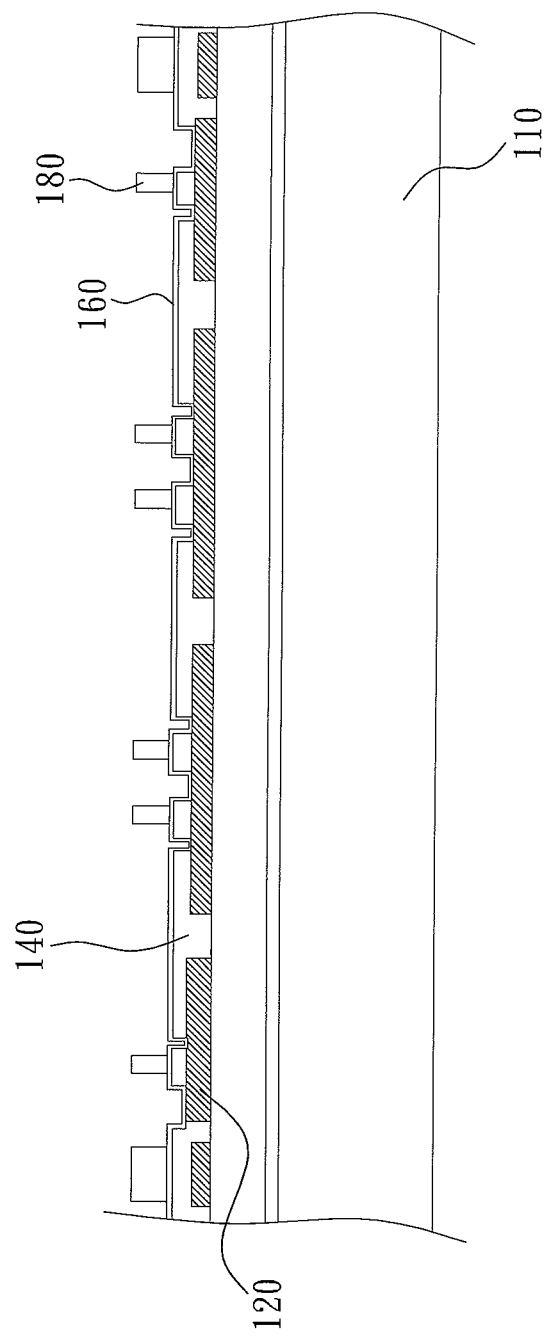
Figure 8A:
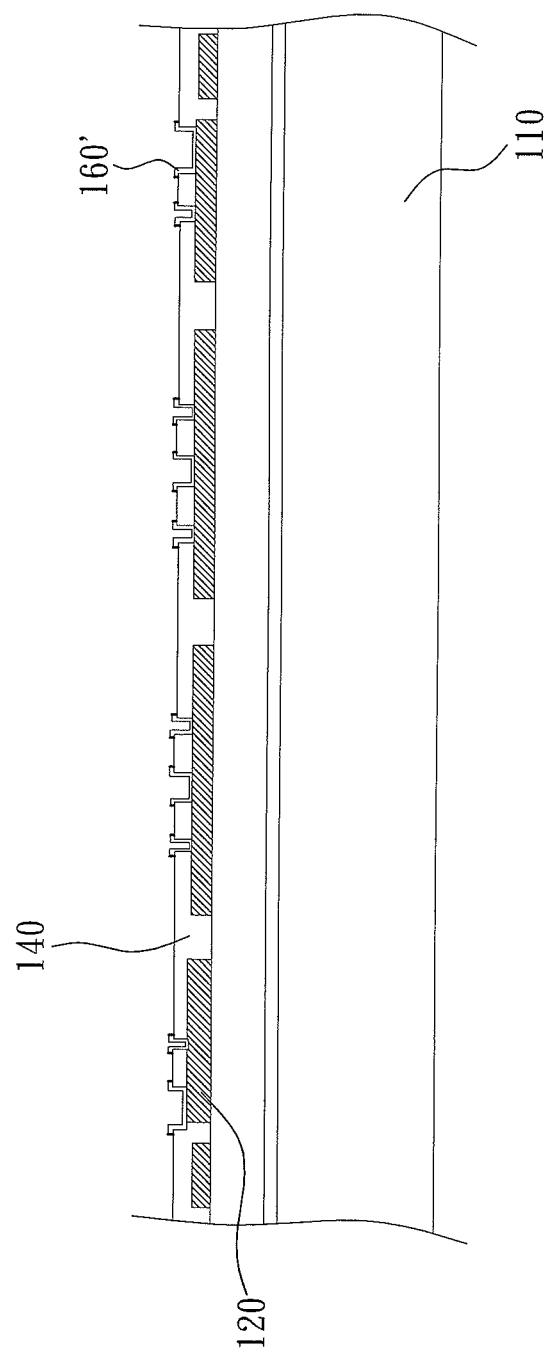
FIGS. 8A-8B illustrates a method for manufacturing the integrated MEMS device according to yet another embodiment of the present invention.
Figure 8B:
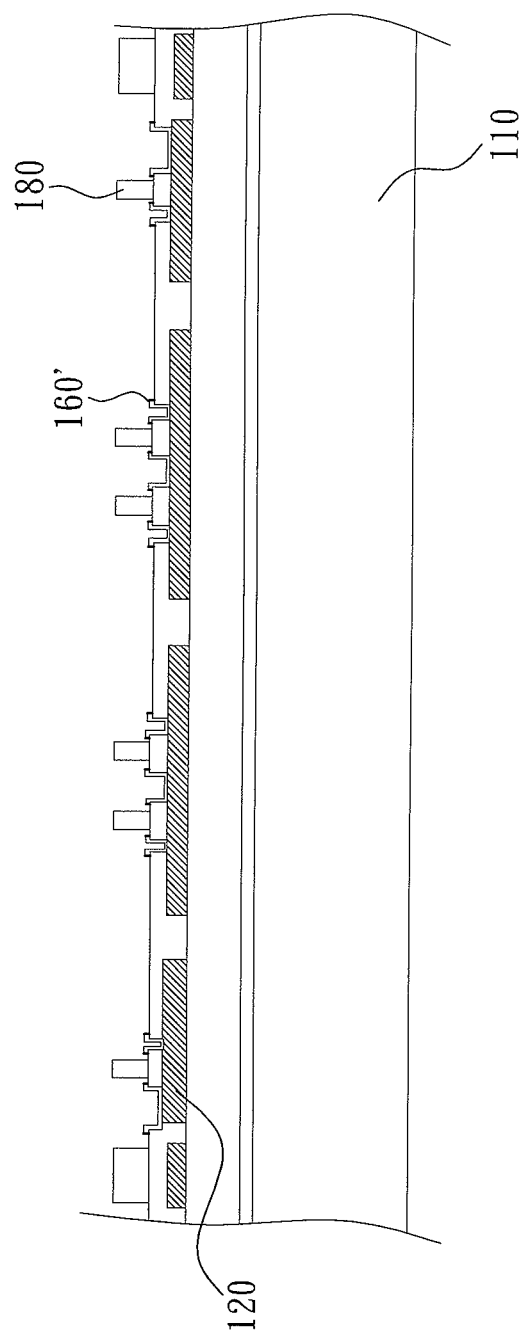

Next, a patterned second bonding layer 180 is formed on the second sacrificial layer 160 by lithography and etching processes according to FIG. 2D, wherein the second bonding layer 180 is composed of a bondable conductive material/materials. In this embodiment, since the second sacrificial layer 160 is formed to cover the whole device wafer 110, the second bonding layer 180 will overlap with a partial of the second sacrificial layer 160. In another embodiment, the overlap can be avoided, as shown in FIG. 8A-8B. A second sacrificial layer 160' is formed and patterned to partially cover the device wafer 110, as shown in FIG. 8A. In this embodiment, the second sacrificial layer 160' is formed to cover an exposed region of the first sacrificial layer 120 and not cover most portion of the first structural layer 140. As such, a patterned second bonding layer 180 can be formed without covering the second sacrificial layer 160' by lithography and etching processes according to FIG. 8B. This embodiment needs an extra photolithography layer to pattern the second sacrificial layer 160'.

Figure 2E:
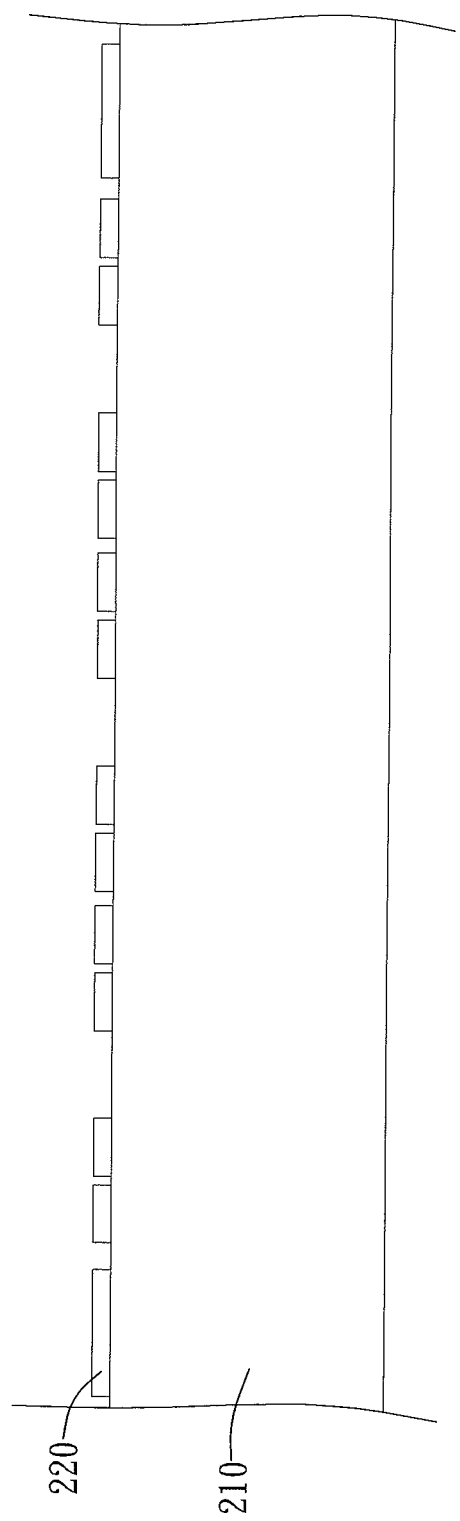

Next, a circuit wafer 210 is provided according to FIG. 2E, wherein one of the surfaces of the circuit wafer 210 comprises at least a patterned first bonding layer 220. The first bonding layer 220 may be composed of a metallic material used by CMOS processes and may further comprise other bondable conductive material/materials. Then, the first bonding layer 220 and the second bonding layer 180 are bonded together by a wafer bonding method such as an eutectic bonding process in order to bond the device wafer 110 and the circuit wafer 210 together. It is noted that when the device wafer 110 is bonded with the circuit wafer 210 in a face-to-face fashion, the first sacrificial layer 120 and the first structural layer 140 could form such a steady structure that it could withstand the temperature and pressure required to bond the device wafer 110 and the circuit wafer 210 together.

Figure 2F:
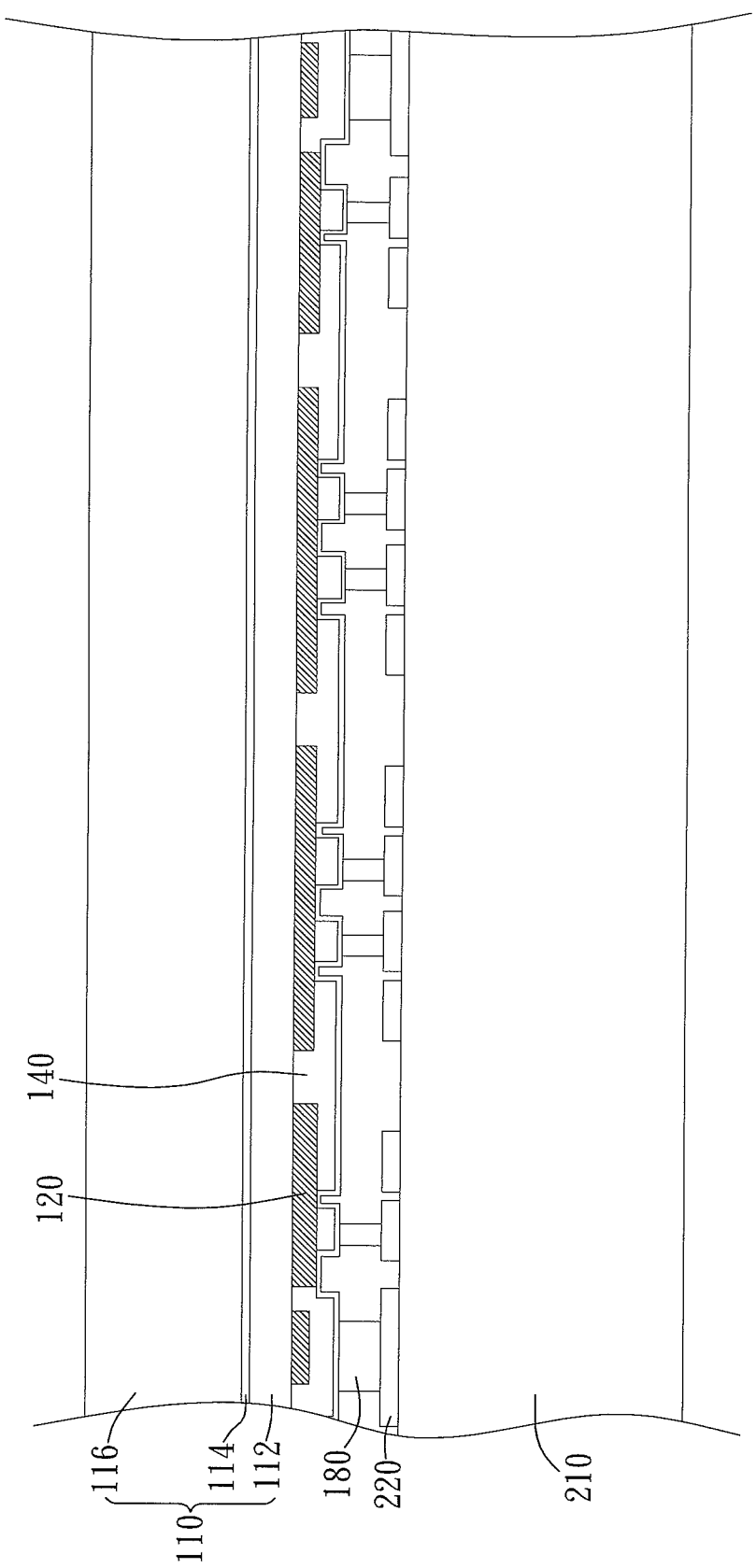
Figure 2G:
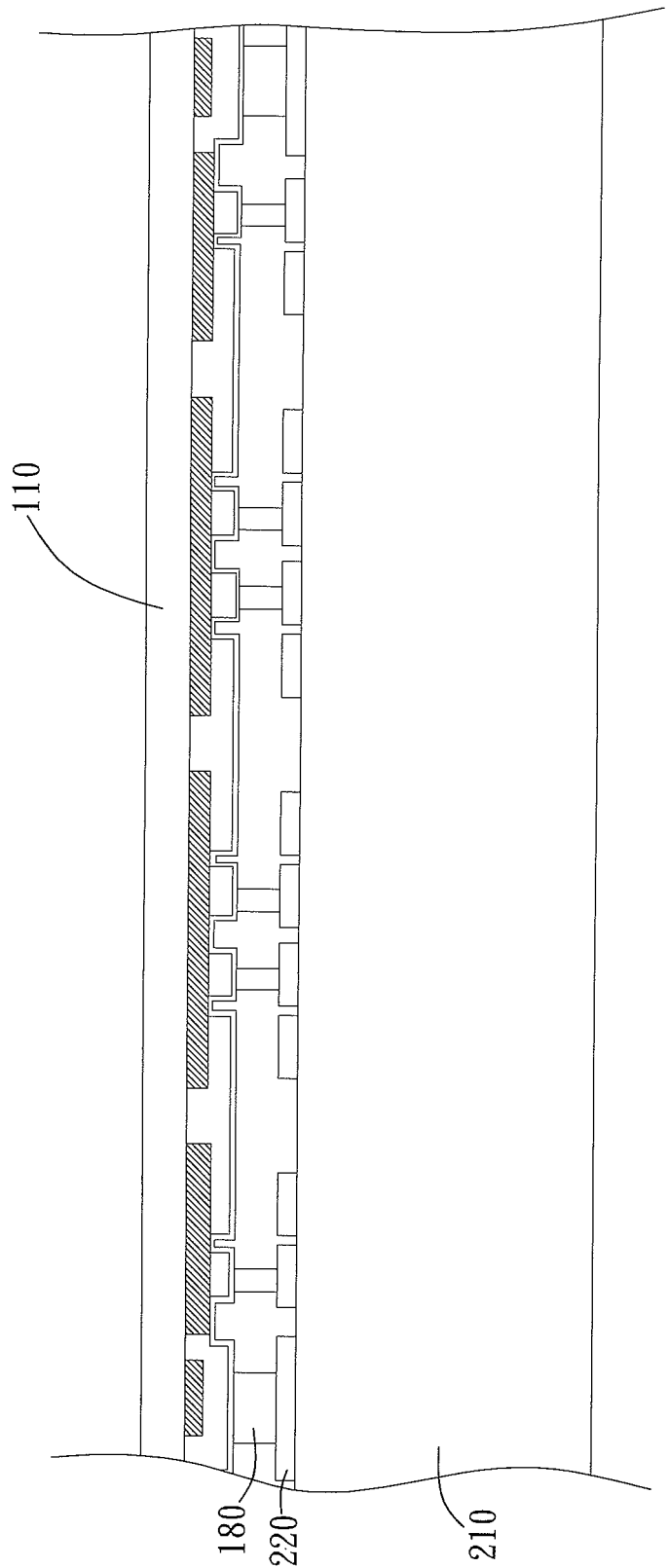

Next, a certain amount of thickness of the device wafer 110 is removed according to FIG. 2G. That is, the device wafer 110 is thinned down. The following paragraph would explain the thinning process of the device wafer 110 in detail.

First, please refer to FIGS. 2F and 2G. The silicon substrate 116 of the device wafer 110 is etched to remove the silicon substrate 116. Then, the insulating layer 114 of the device wafer 110 is removed while the silicon device layer 112 remains, wherein the silicon device layer 112 for example is composed of monocrystalline silicon. Since the insulating layer 114 and the silicon substrate use different materials, the insulating layer 114 could be used as an etching stop layer during the etching process. By doing so, the removed thickness of the device wafer 110 could be controlled accurately. Of course, a person of ordinary skills in the art could use other methods to reduce the thickness of the device wafer 110 such as mechanical lapping, grinding, chemical polishing and/or chemical mechanical polishing. Furthermore, the device wafer 110 is not limited to a structure of silicon on insulator (SOI).

Figure 2H:
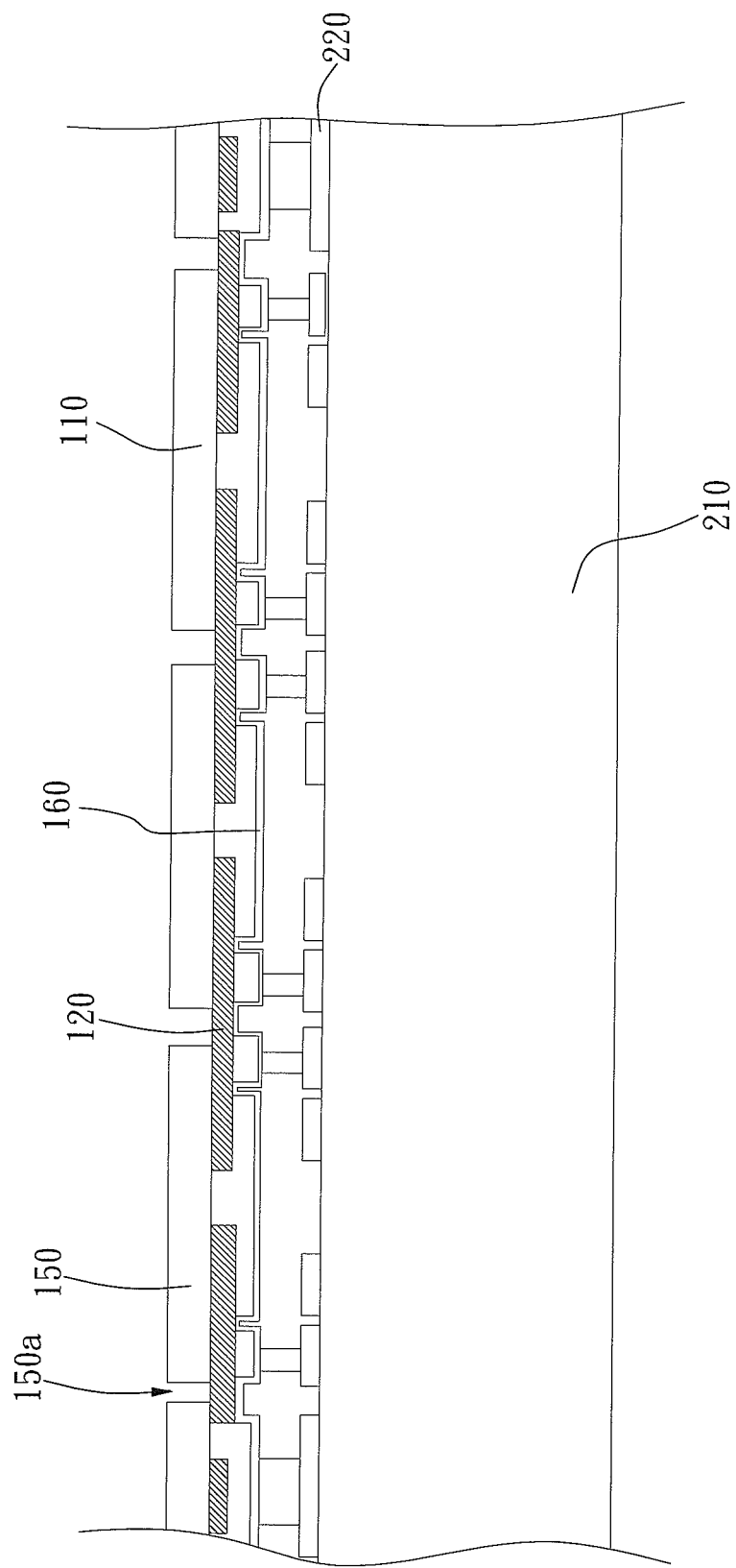

After thinning the device wafer 110, the device wafer 110 is patterned to form a patterned second structural layer 150 according to FIG. 2H. Since this second structural layer 150 is composed of monocrystalline silicon, it has less stress and smoother surface. As seen from FIG. 2H, there are a plurality of openings 150a formed in the second structural layer 150 and these openings expose a portion of the first sacrificial layer 120. Please note that the first sacrificial layer 120 can be acted as stop layer and protection layer to prevent defect generation such as PID (plasma induced damage) during forming the plurality of openings 150a.

Figure 2I:
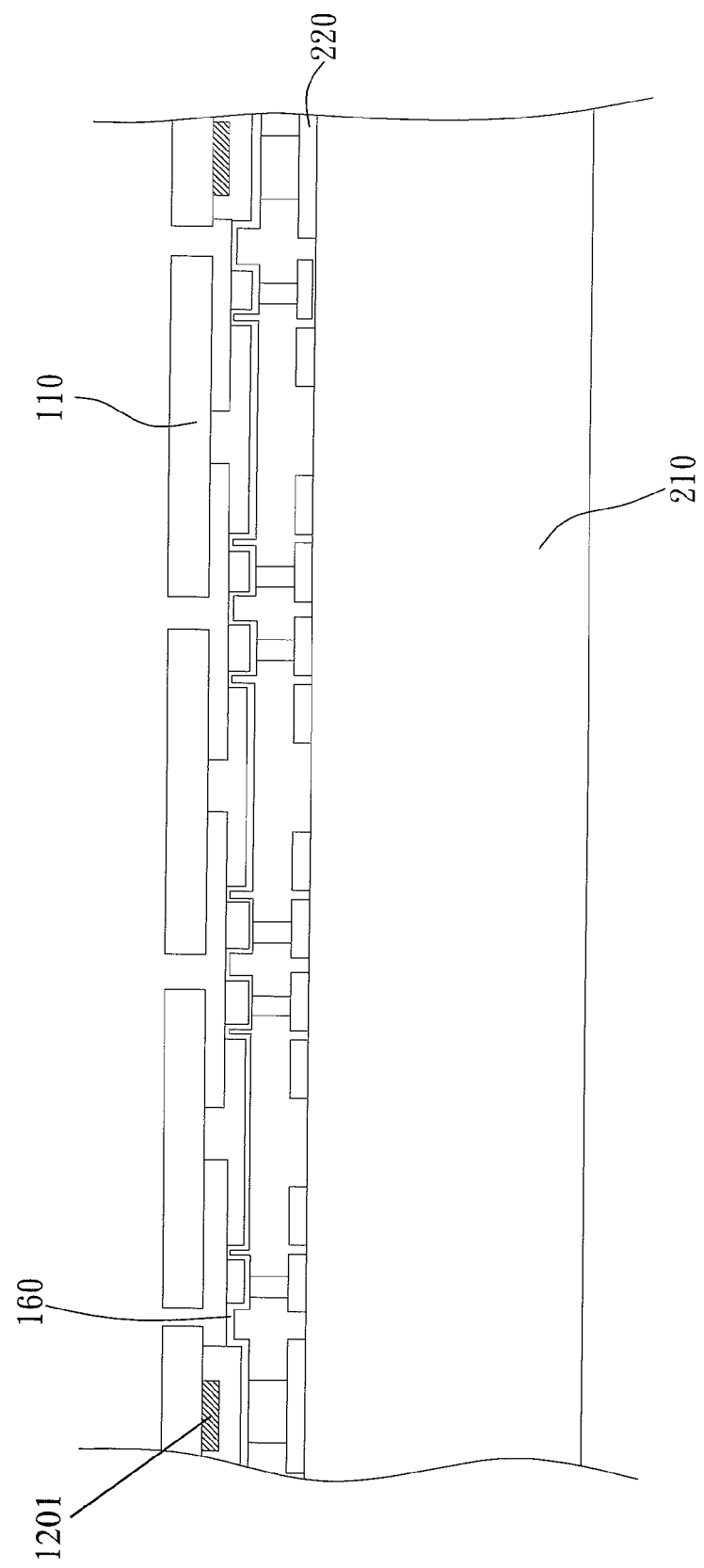

Next, the portion of the first sacrificial layer 120 exposed by those openings 150a is removed by for example etching and the rest portion 1201 of the first sacrificial layer 120 not exposed by those openings 150a remains according to FIG. 2I.

Moreover, since there is etching selectivity between the first sacrificial layer 120 and the second sacrificial layer 160, during wet etching of the first sacrificial layer 120, the sacrificial layer 160 could protect the devices on/within the circuit wafer 210 from being exposed to the etchants used to etch the first sacrificial layer 120, thereby preventing the devices on/within the circuit wafer 210 from damages. Then, the second sacrificial layer 160 is removed according to FIG. 2J. Still referring to FIG. 2J, it is found that, due to a portion of second sacrificial layer 1601 sandwiched between the second bonding layer 180 and the first structural layer 140, that portion of second sacrificial layer 1601 remains after completion of the integrated MEMS device wafer 100 while the rest exposed portion of the second sacrificial layer is completely removed. Because the second sacrificial layer 1601, the second bonding layer 180 and the first bonding layer 220 are all composed of conductive material/materials, they form a part of the electrical conductive path between the circuit wafer 210 and the device wafer 110 to transmit signals generated by the circuit wafer 210 to the first structural layer 140. Since the first structural layer 140 and the second structural layer 150 are physically coupled and movable jointly, it is possible to control the movement of the first structural layer 140 via electrode 2201 in the first bonding layer 220 in order to adjust the deformation of the second structural layer 150 hence the reflected direction of incident light shining thereon. The manufacturing of the integrated MEMS device wafer 100 is thus preliminarily completed.

It should be noted that in the foresaid embodiment the device wafer 110 and the circuit wafer 210 are bonded together by bonding the first bonding layer 220 and the second bonding layer 180. However, in an alternative embodiment the second bonding layer 180 could be omitted and the first bonding layer 220 is bonded to the second sacrificial layer 160. Or, in another alternative embodiment it is possible to bond the device wafer 110 and the circuit wafer 210 together by bonding the first bonding layer 220 directly to the first structural layer 140 without the second bonding layer 180 and the second sacrificial layer 160. The material of the first bonding layer 220 is such as gold, the material of the first structural layer 140 is such as polysilicon or amorphous silicon, and the bonding method is such as eutectic bonding.

It should also be noted that in the embodiment that a second sacrificial layer 160' is patterned, as shown in FIG. 8B, the second sacrificial layer 160' will be entirely removed due to no second bonding layer 180 covering the second sacrificial layer 160'.

Aside from using said second sacrificial layer 160 to protect the devices on/within the circuit wafer 210, it is also possible to cover the circuit wafer 210 with an additional passivation layer (not shown). This passivation layer is made for example from polymer/polymers and serves to cover regions outside a to-be-bonded region of the first bonding layer 220. In this present invention, the to-be-bonded region of the first bonding layer 220 refers to a region used to be bonded to the second bonding layer 180 or other devices during the manufacturing process. This passivation layer composed of polymer/polymers can protect the devices on/within the circuit wafer 210 from etchants used to etch the first sacrificial layer 120 while the first sacrificial layer 120 is wet etched. By doing so, there is no need to use the second sacrificial layer 160, thereby omitting process steps involving the second sacrificial layer 160 such as the step shown by FIG. 2C. However, it should be noted that most polymers can not withstand high temperature, so the process used to bond the device wafer 110 and the circuit wafer 210 is limited to a relatively-low-temperature process.

Figure 2J:
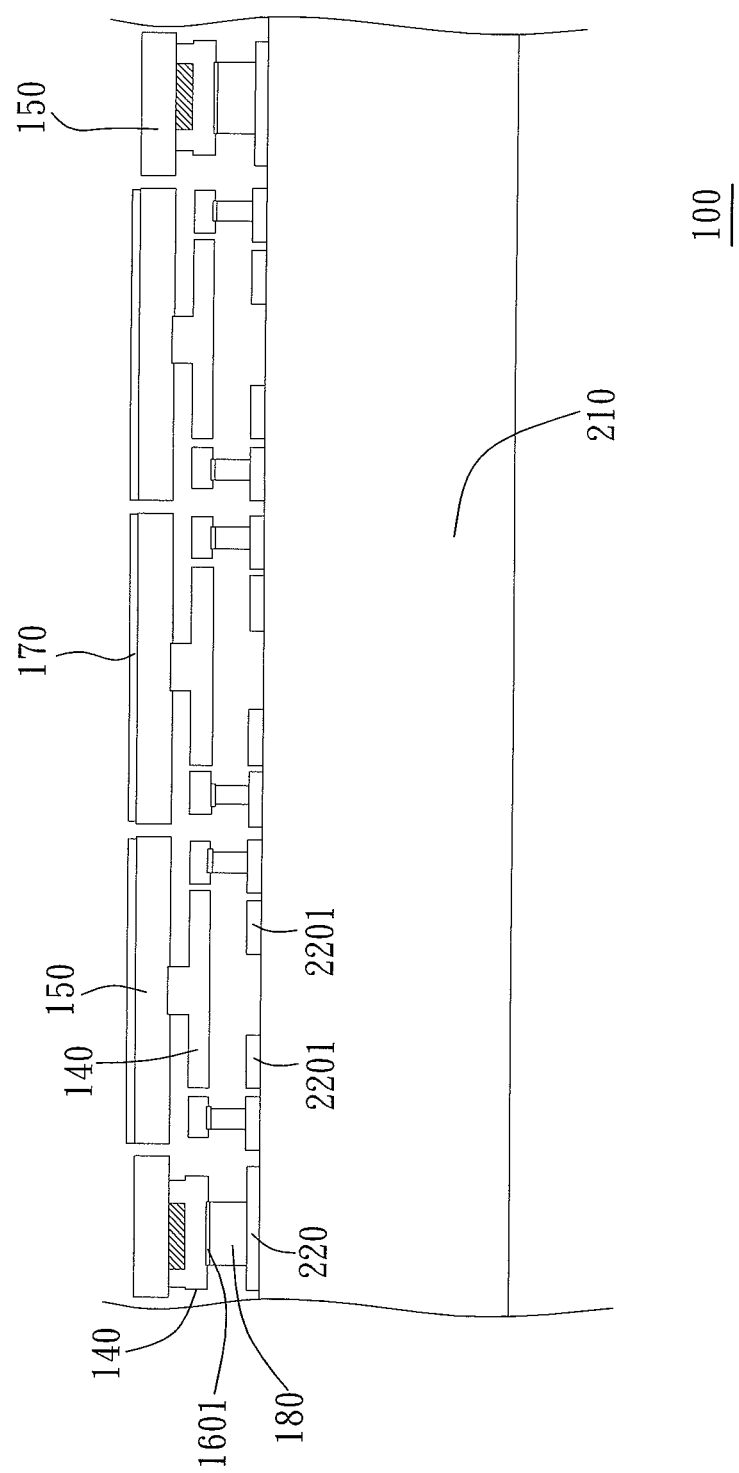

Still referring to FIG. 2J, a patterned metal layer 170 is optionally formed on the second structural layer 150 to reflect incident light. In this embodiment, the patterned metal layer 170 is formed after the formation of the second structural layer 150, but the patterned metal layer 170 may be formed before patterning the second structural layer 150. Afterward, the integrated MEMS wafer 100 could be cut into a plurality of integrated MEMS devices. After cutting the integrated MEMS wafer 100, what used to be a part of the device wafer 110 could be called a device chip while what used to be a part of the circuit wafer 210 could be called a circuit chip.

Figure 1:
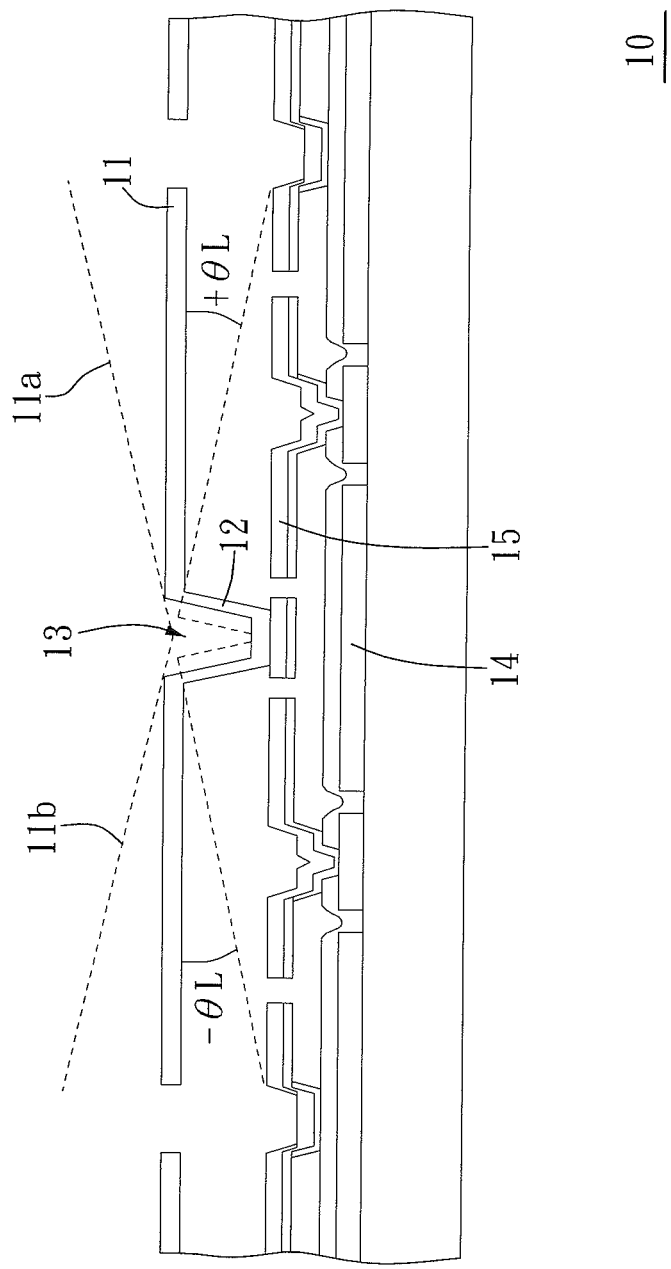
FIG. 1 illustrates the structure of the optical array-type device disclosed by U.S. Pat. No. 5,083,857.

Please compare the structures shown in FIG. 2J and in FIG. 1. The first structural layer 140 (corresponding to the flexible structural layer 15 in FIG. 1) is completely hidden under the second structural layer 150 (corresponding to the reflective mirror 11 in FIG. 1). Unlike reflective mirror 11 of FIG. 1, the second structural layer 150 does not have a recess. 13 as the one shown in FIG. 1. Furthermore, monocrystalline silicon has better planar surface topography. Due to these reasons the structure shown in FIG. 2J could make more efficient use of light. From FIGS. 2A-2J, it is clear that, unlike prior art completes the circuit wafer and performs micro machining on the circuit wafer, the present invention could manufacture the device wafer 110 and the circuit wafer 210 separately. Therefore, unlike prior art limits the materials and temperatures used during device manufacturing, the present invention is not bound by such limits during manufacturing the device wafer 110. Moreover, it is more cost and process efficient to manufacture the device wafer 110 and the circuit wafer 210 separately.

Figure 3:
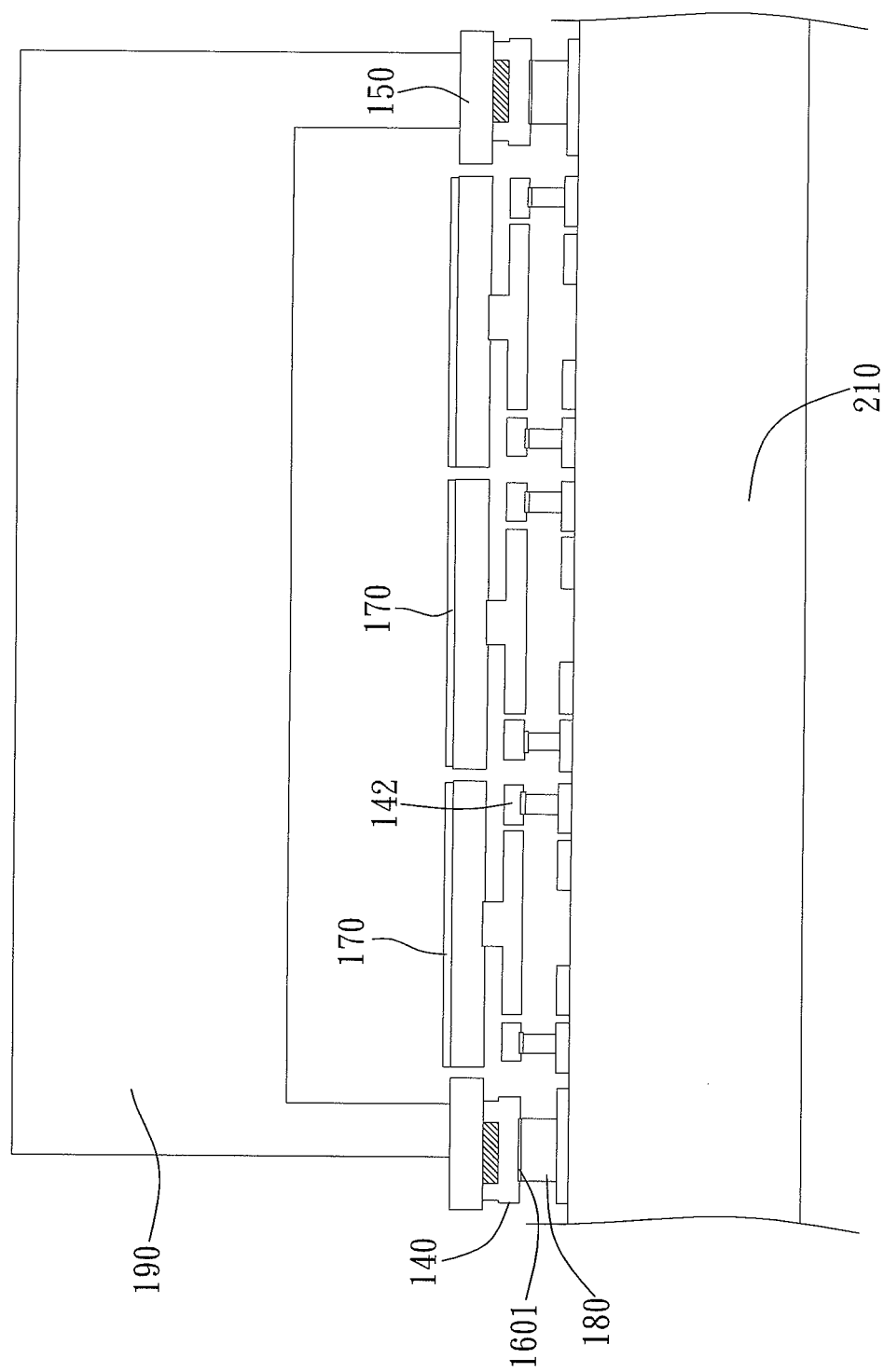
FIG. 3 illustrates the integrated MEMS device according to another embodiment.

Please refer to FIG. 3 which illustrates an integrated MEMS device according to another embodiment of the present invention. After forming and patterning the patterned metal layer 170 (as shown in FIG. 2J), a cover wafer 190 is disposed above the second structural layer 150, wherein the cover wafer 190 is fixed on the second structural layer 150 by polymer bonding or anodic bonding. In this embodiment, the cover wafer 190 is mainly made of glass and for protecting the internal wiring of the integrated MEMS wafer 100 from external contaminations. Thereafter, the integrated MEMS wafer 100 is cut into a plurality of integrated MEMS devices.

Figure 4:
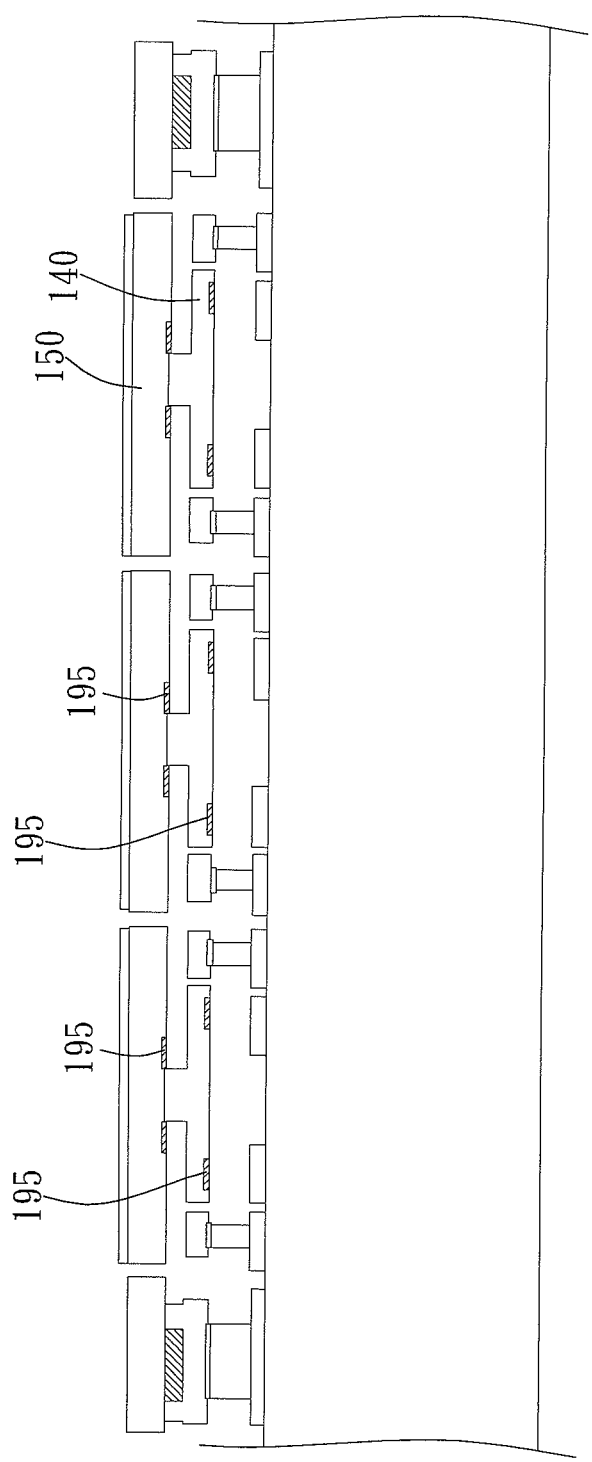
FIG. 4 illustrates the integrated MEMS device according to yet another embodiment.

Please refer to FIG. 4 which illustrates an integrated MEMS device according to still another embodiment of the present invention. Implantation processes of different dopant concentrations are performed in appropriate regions of the first structural layer 140 and/or the second structural layer 150 in order to form multiple localized piezoresistive regions 195 of low dopant concentrations and a connecting/bonding region of high dopant concentration (not shown). The implantation processes can be executed at between the processes as shown in FIG. 2A and FIG. 2B, and/or between the processes as shown in FIG. 2B and FIG. 2C in the foresaid embodiment. The piezoresistive regions 195 could be used to sense stress generated by the movements of the first structural layer 140 or the second structural layer 150 hence the moving status of the second structural layer 150. With this feature, actuators or sensors with feedback-loop and better precise performance could be achieved.

In the foresaid embodiments of integrated MEMS devices, array-type optical devices are used as examples. However, the manufacturing processes shown in FIGS. 2A-2J could be used to manufacture other types of MEMS devices. Please refer to FIGS. 5A to 5C which illustrates an integrated MEMS device according to yet another embodiment of the present invention. The integrated MEMS device 300 of this embodiment comprises a circuit chip 410 and a device chip 310. A first bonding layer 420 is formed on the surface of the circuit chip 410. The device chip 310 comprises a second bonding layer 380, a first structural layer 340 and a second structural layer 350. The patterned first bonding layer 420 is disposed on the circuit chip 410 and the second bonding layer 380 is connected to the first bonding layer 420. Furthermore, the first structural layer 340 is sandwiched between the second structural layer 350 and the second bonding layer 380. Furthermore, please refer to FIG. 5B. In the integrated MEMS device 300' shown in FIG. 5B, implantation processes of different dopant concentrations are performed in appropriate regions of the second structural layer 350 in order to form multiple localized piezoresistive regions 395 of low dopant concentrations and a connecting/bonding region of high dopant concentration (not shown). The piezoresistive regions 395 could be used to sense stress generated by the movements of the second structural layer 350 hence achieving actuators or sensors with feedback-loop and better precision. Moreover, the piezoresistive regions 395 could also be disposed in the first structural layer 340 (not shown).

Figure 5A:
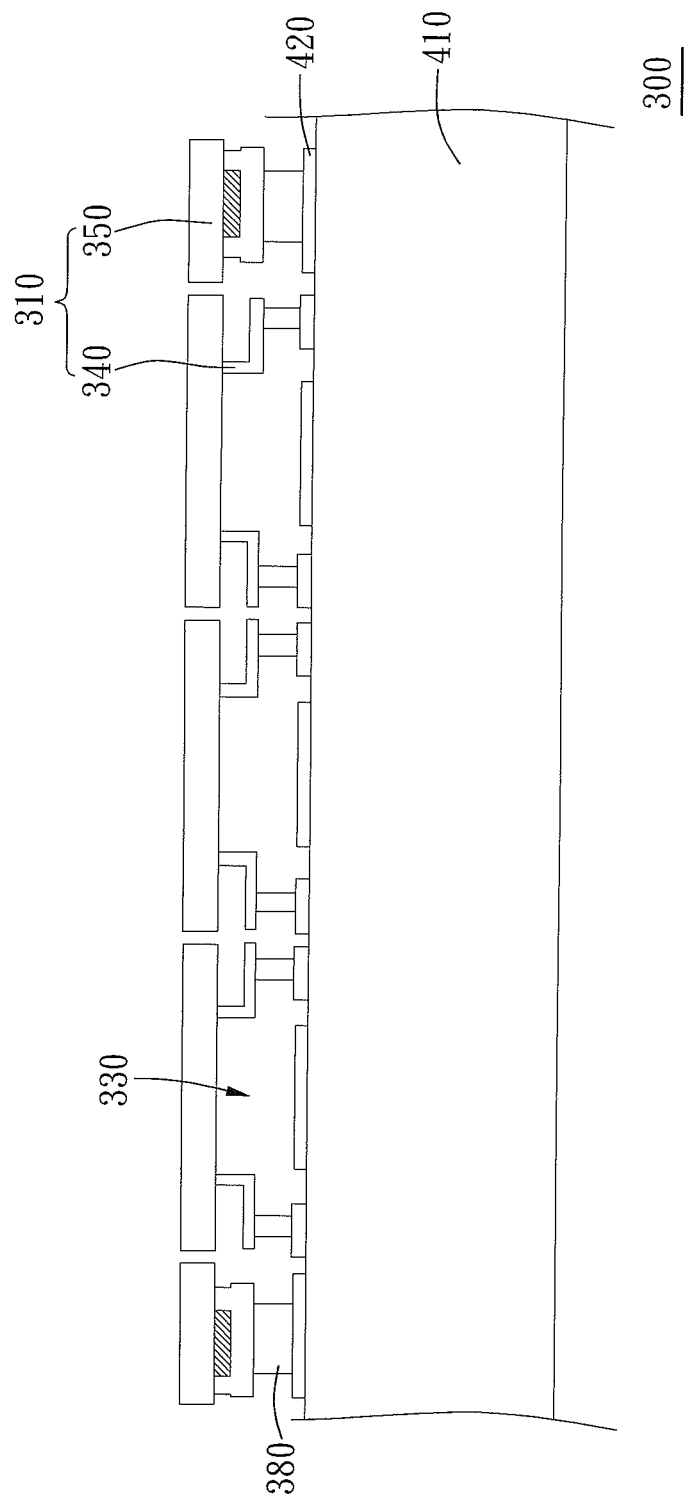
FIGS. 5A to 5C illustrates the integrated MEMS device according to yet another embodiment.
Figure 5B:
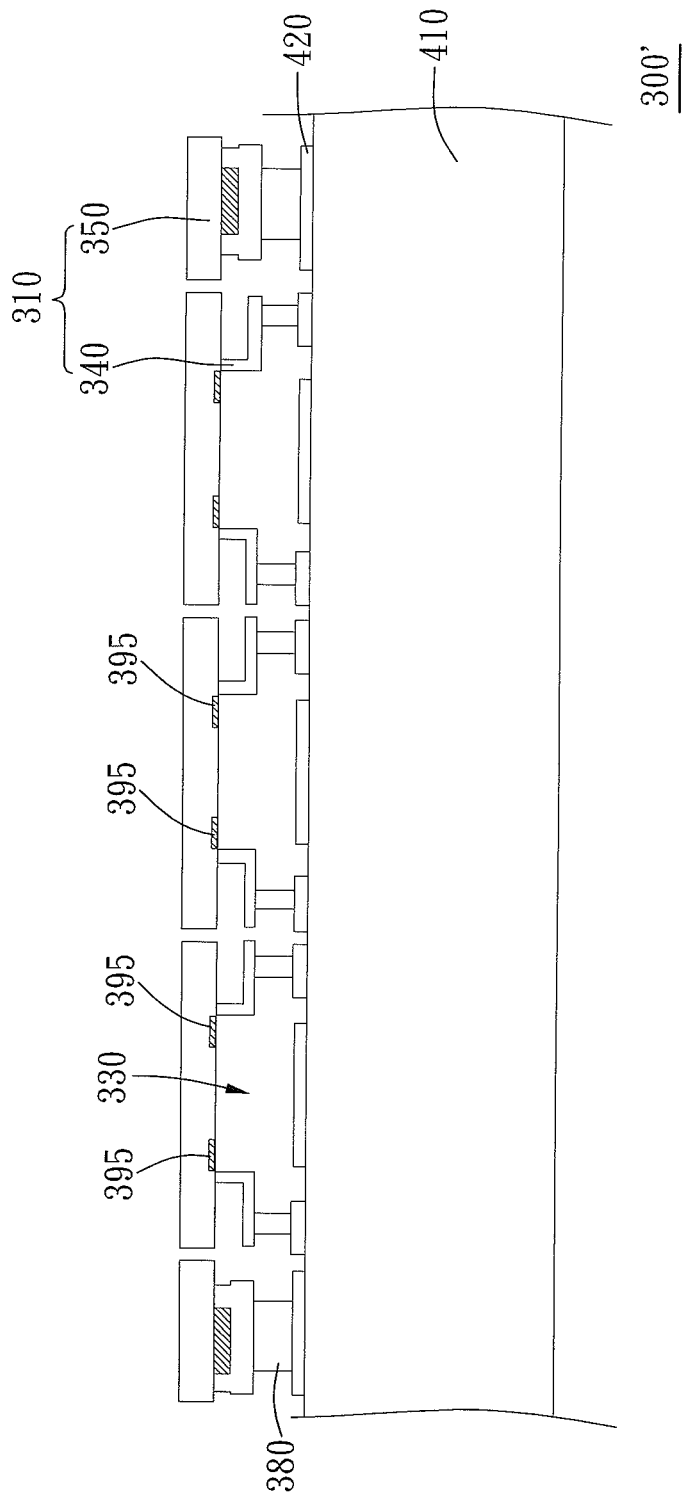
Figure 5C:
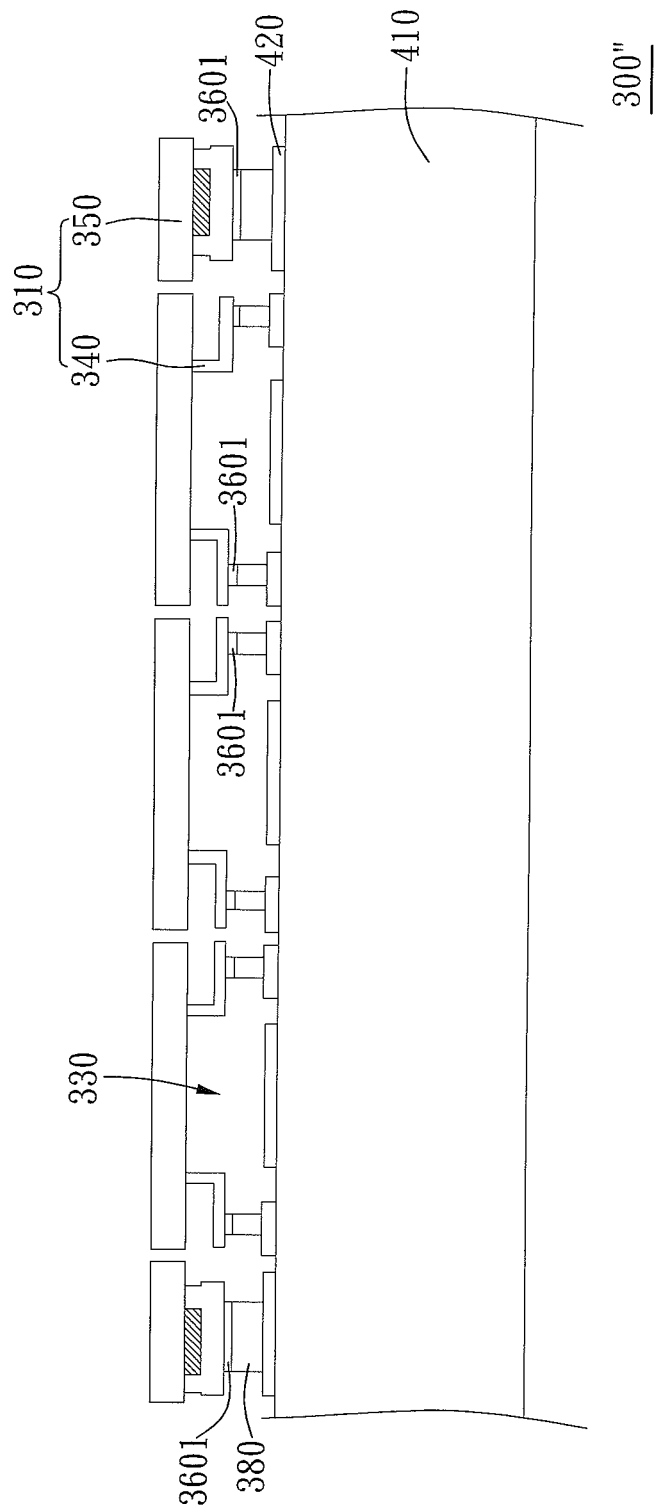

Furthermore, in the integrated MEMS device 300' shown in FIG. 5C, an additional second sacrificial layer 3601 could be disposed between the second bonding layer 380 and the first structural layer 340 depending on different purposes, wherein the second sacrificial layer 3601 is composed of a conductive material/materials. In the embodiment shown in FIG. 5C, the second sacrificial layer 3601 is similar to the second sacrificial layer 1601 because both of them are the remained sacrificial layers after completing the manufacturing process for the MEMS device.

In the foresaid embodiment, the device wafer 310 and the circuit wafer 410 are bonded together by bonding the first bonding layer 420 and the second bonding layer 380. However, it is possible to omit the second bonding layer 380 and have the first bonding layer 420 and the second sacrificial layer bonded directly. Or, the device wafer 310 and the circuit wafer 410 could be bonded together by bonding the first bonding layer 420 and the first structural layer 340 directly without disposing the second bonding layer 380 and the second sacrificial layer. In such embodiment some bump structures (not shown) made of the first structure layer 340 can be adopted and bonded to the first bonding layer in order to generate a spacing for deformation of the first structure layer 340.

Figure 6:
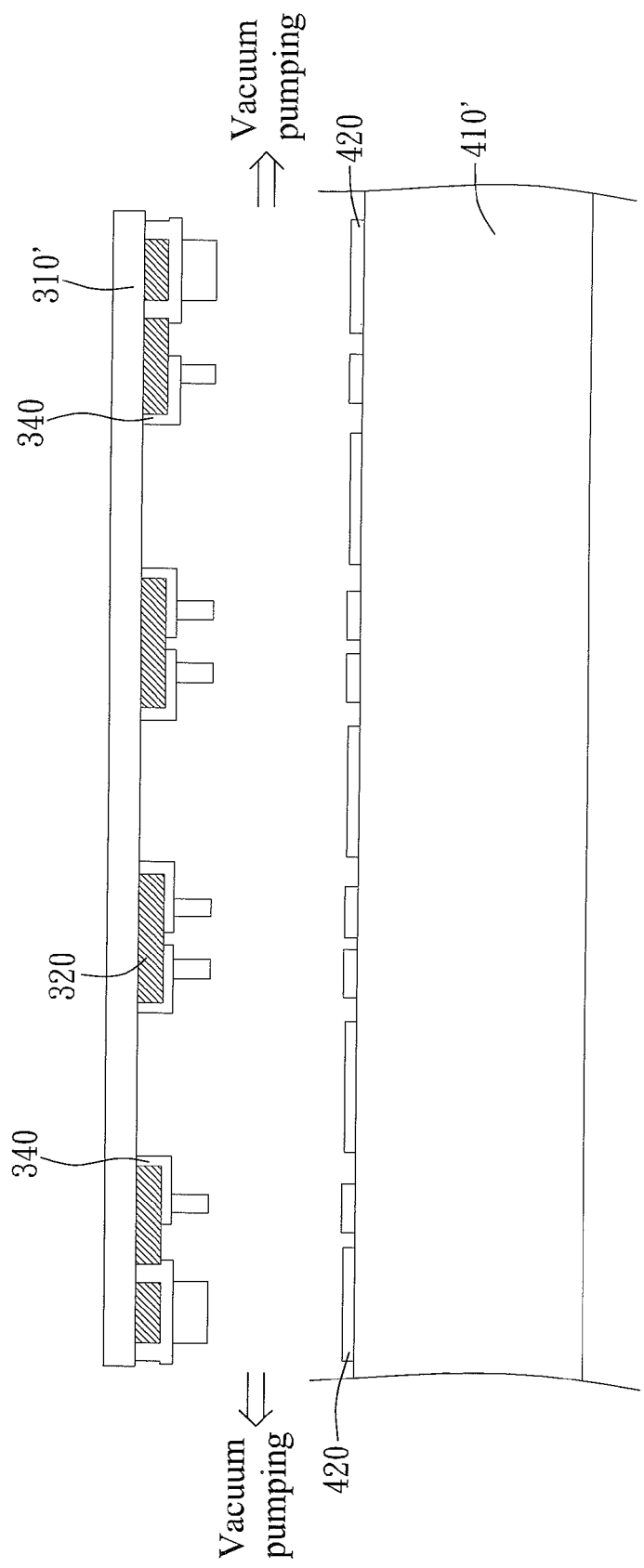
FIG. 6 is the schematic figure showing the integrated MEMS device upon evacuation.

It should be noted that there are many hermetic spaces 330 formed between the second structural layer 350 and the circuit chip 410, wherein the hermetic spaces 330 are enclosed by the first structural layer 340, the second structural layer 350, the second bonding layer 380 and the circuit chip 410. These hermetic spaces 330 in its vacuum state could facilitate the ability of the integrated MEMS device 300 to sense a change of the external air pressure sensibly and could reduce air resistance. Or, these hermetic spaces 330 could for example serve as acoustic transducers or ultrasonic transducers. To form the hermetic spaces 330 in its vacuum state, please refer to FIG. 6. Before bonding the device wafer 310' against the circuit wafer 410', an evacuation process is performed. By doing so, the hermetic spaces 330 in its vacuum state could be formed after the second bonding layer 380 of the device wafer 310' and the first bonding layer 420 of the circuit wafer 410' are bonded together. After bonding the device wafer 310' and the circuit wafer 410', the device wafer 310' is patterned and the first sacrificial layer 320 is removed. Afterward, a cutting process is performed to form the integrated MEMS device 300 shown in FIG. 5.

In FIG. 5A, the second structural layer 350 is made rigidly while the first structural layer 340 is made flexible so as to provide the device a required movement DOF (degree of freedom). In some applications, however, the second structural layer 350 can be made flexible and omit the first structural layer 340. To realize the structure, please refer to FIG. 7A-FIG. 7B.

Figure 7A:
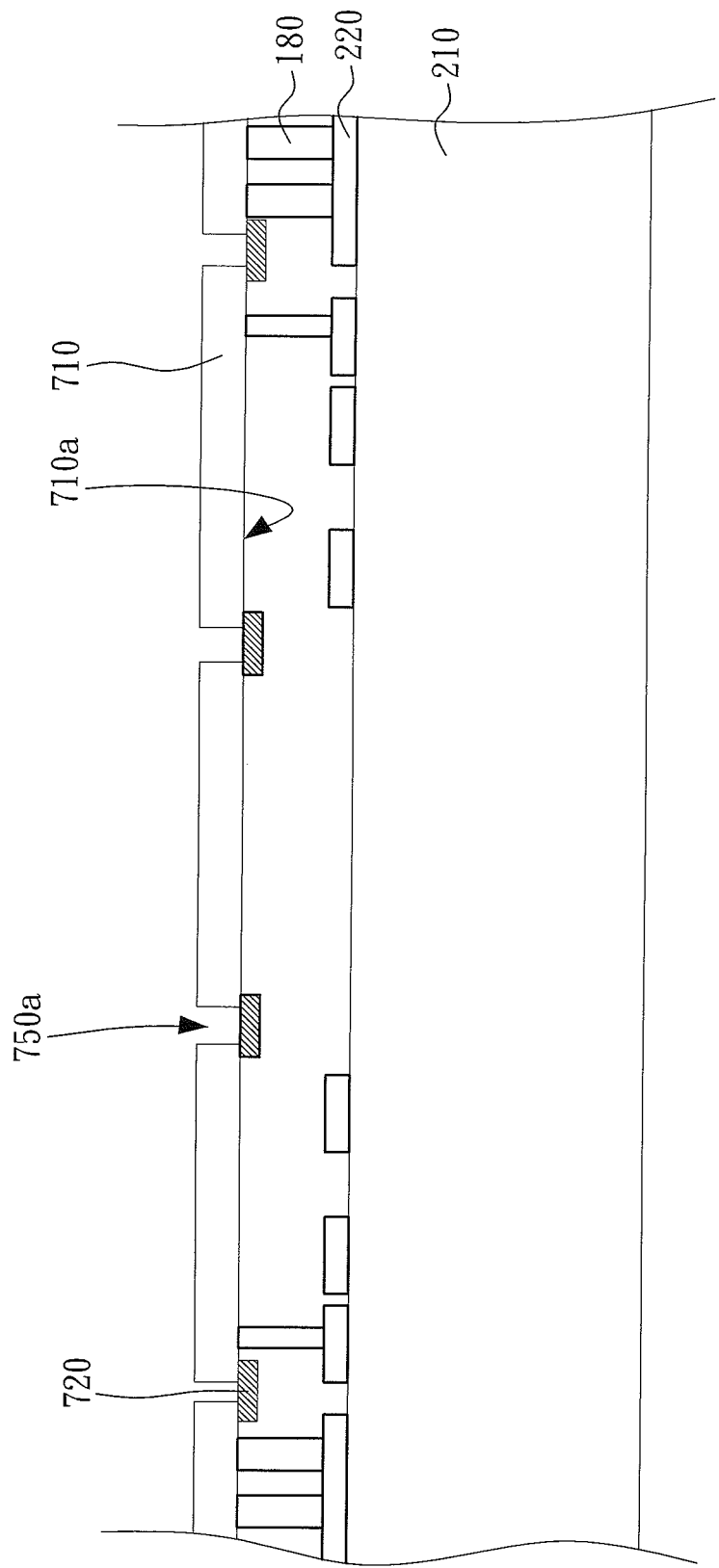
FIGS. 7A-7B illustrates a method for manufacturing the integrated MEMS device according to another embodiment of the present invention.
Figure 7B:
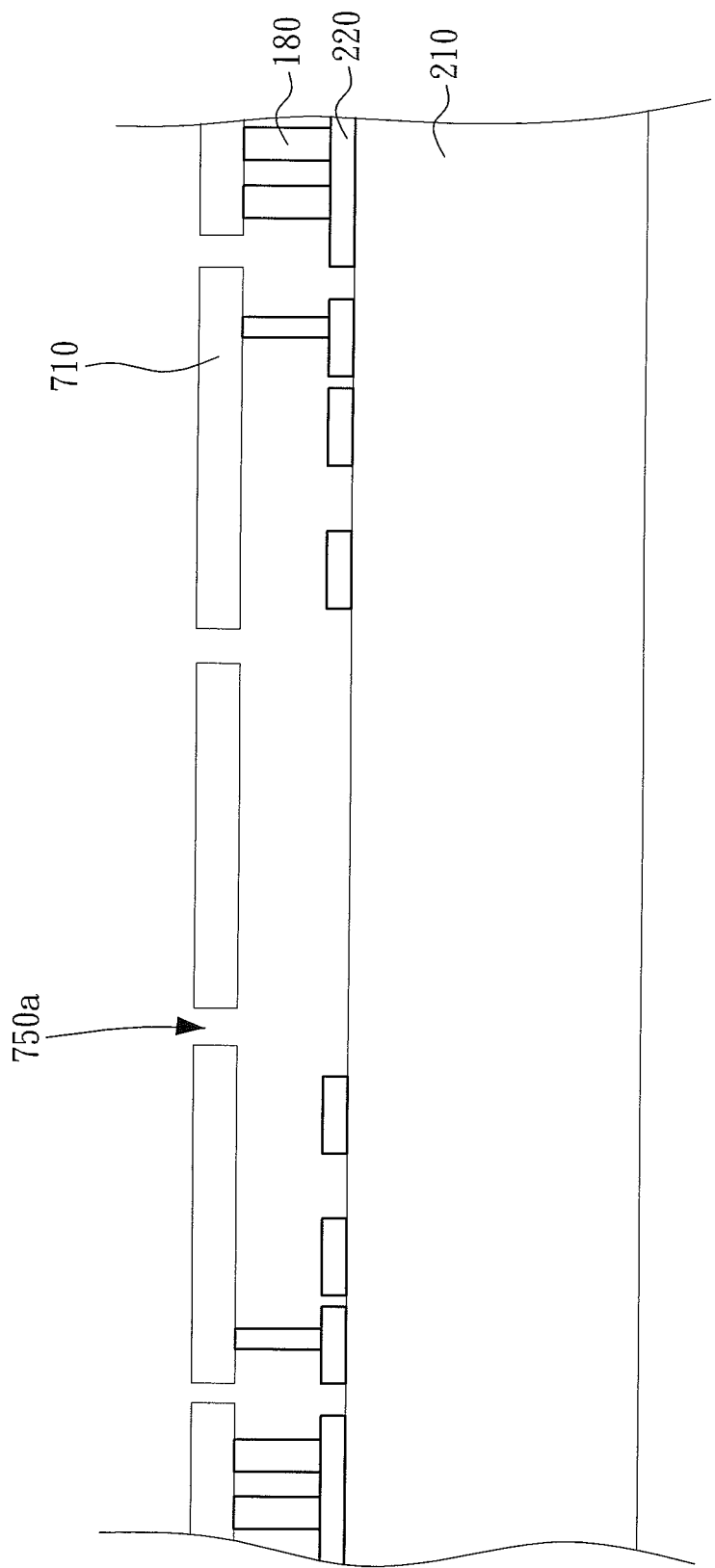

As shown in FIG. 7A, a first sacrificial layer 720 is formed and patterned on a first surface 710a on the device wafer 710. In this embodiment, the first sacrificial layer 720 is mainly composed of silicon oxide, metal such as copper or chromium, or silicon oxide/metal composite film. A patterned second bonding layer 180 composed of a bondable conductive material/materials can also be sequentially formed, to ease the wafer to wafer bonding process. A circuit wafer 210 comprising at least a patterned first bonding layer 220 is then bonded to the device wafer 710 together by a wafer bonding method such as an eutectic bonding process. The first bonding layer 220 may be composed of a metallic material used by CMOS processes and may further comprise other bondable conductive material/materials. Please be noted that the second bonding layer 180 can also be omitted. In such case, the first bonding layer 220 is directly boned to the structure layer 710. In such embodiment some bump structures (not shown) made of the structure layer 710 can be adopted and bonded to the first bonding layer in order to generate a spacing for deformation of structure layer 710. The device wafer 710 is then patterned to form a patterned second structural layer, after thinning the device wafer 710. Since this second structural layer 710 is composed of monocrystalline silicon, it has less stress and smoother surface. As seen from FIG. 7A, a plurality of openings 750a are formed and these openings 750a expose a portion of the first sacrificial layer 720. The first sacrificial layer 720 can be acted as stop layer and protection layer to prevent defect generation such as PID (plasma induced damage) during forming the plurality of openings 750a. The portion of the first sacrificial layer 720 exposed by those openings 750a is then removed by for example etching, as shown in FIG. 7B. In this embodiment, the second structural layer 710 is made flexible in in-plan or out-of-plan direction. The material of the first sacrificial layer 720 is chosen that it can prevent the devices on/within the circuit wafer 210 from damages during it being etched.

From all the embodiments described earlier, it is clear that by forming a sacrificial layer such as the first sacrificial layer then removing the sacrificial layer it is possible to make the structure shown in FIG. 5 with the first structural layer 340 hidden inside and this kind of structure could not be made by conventional process. With this kind of structure, a variety of MEMS devices could be manufactured. Although the integrated MEMS wafer 100 and the integrated MEMS device 300 are of array-type, the manufacturing processes shown in FIGS. 2A-2J is not limited for array-type and could be used for other types of MEMS structures.

Although the embodiments have been described in some detail for the purpose of promoting clarity of understanding, they are not intended to limit the claim scope the present invention. The scope of the present invention is defined by the appended claims and their equivalents. It is clear to a person of ordinary skill in the art that various omissions, substitutions, modifications and changes in the form of the embodiments described herein may be made without departing from the spirit of the present invention. The appended claims and their equivalents are intended to cover such forms or modifications as would fall within the scope and spirit of the present invention.

What is claimed is:

1. A method for manufacturing an integrated MEMS device, comprising:
   (a) providing a device wafer and forming a patterned first sacrificial layer and a first structural layer on the device wafer sequentially;
   (b) providing a circuit wafer having at least a patterned first bonding layer thereon;
   (c) bonding the first bonding layer on the circuit wafer to the device wafer;
   (d) patterning the device wafer to form a patterned second structural layer and to expose a portion of the first sacrificial layer; and
   (e) removing the first sacrificial layer;
   wherein, between the step (a) and step (b), further comprising a step (a'): forming a patterned second bonding layer on the first structural layer; and
   in the step (c) further comprising a step of bonding the first bonding layer to the second bonding layer.

2. The method of claim 1, further comprising:
   in the step (a) further comprising a step of forming a second sacrificial layer after forming the first structural layer to at least cover an exposed region of the first sacrificial layer on the device wafer; and
   in the step (e) further comprising a step of removing the second sacrificial layer.

3. The method of claim 2, wherein the second sacrificial layer is composed of copper or chromium.

4. The method of claim 1, further comprising:
   covering the circuit wafer with a protective layer, wherein the protective layer at least covers regions outside a to-be-bonded region of the first bonding layer.

5. The method of claim 1, between the step (c) and step (d), further comprising:
   thinning down the device wafer from a backside thereof to remove a certain amount of thickness.

6. The method of claim 5, wherein the device wafer comprises a silicon device layer, an insulating layer and a silicon substrate, a first surface is on the silicon device layer and a second surface is on the silicon substrate, the step of thinning down the device wafer from the backside comprising the following steps:
   removing the silicon substrate by grinding, polishing or etching; and
   removing the insulating layer.

7. The method of claim 1, wherein the second bonding layer and the first bonding layer are both composed of a bondable conductive material/materials.

8. The method of claim 1, wherein the first structural layer is mainly composed of polysilicon, monocrystalline silicon, or amorphous silicon, and the second structural layer is mainly composed of monocrystalline silicon.

9. The method of claim 1, wherein at least a piezoresistive sensing unit is formed in the first structural layer or the second structural layer.

10. The method of claim 1, after the step (c) further comprising:
    forming a plurality of hermetic spaces between the device wafer and the circuit wafer.

11. A method for manufacturing an integrated MEMS device, comprising:
    (a) providing a device wafer and forming a patterned first sacrificial layer on the device wafer;
    (b) providing a circuit wafer having at least a patterned first bonding layer thereon;
    (c) bonding the first bonding layer on the circuit wafer to the device wafer;

(d) patterning the device wafer to form a patterned second structural layer and to expose a portion of the first sacrificial layer; and
(e) removing the first sacrificial layer;
wherein, between the step (a) and step (b), further comprising a step (a'): forming a patterned second bonding layer outside the first sacrificial layer region; and
in the step (c) further comprising a step of bonding the first bonding layer to the second bonding layer.

12. The method of claim 11, the first sacrificial layer is mainly composed of silicon oxide, metal, or silicon oxide/metal composite film.

13. A method for manufacturing an integrated MEMS device, comprising:
   (a) providing a device wafer and forming a patterned first sacrificial layer and a first structural layer on the device wafer sequentially;
   (b) providing a circuit wafer having at least a patterned first bonding layer thereon;
   (c) bonding the first bonding layer on the circuit wafer to the device wafer;
   (d) patterning the device wafer to form a patterned second structural layer and to expose a portion of the first sacrificial layer; and
   (e) removing the first sacrificial layer;
   wherein the first sacrificial layer and the first structural layer are patterned by photolithography and etching processes.

14. A method for manufacturing an integrated MEMS device, comprising:
   (a) providing a device wafer and only forming a patterned first sacrificial layer on the device wafer;
   (b) providing a circuit wafer having at least a patterned first bonding layer thereon;
   (c) bonding the first bonding layer on the circuit wafer to the device wafer;
   (d) patterning the device wafer to form a patterned second structural layer and to expose a portion of the first sacrificial layer; and
   (e) removing the first sacrificial layer.

* * * * *